(12) United States Patent
Abdelhalim et al.

(10) Patent No.: US 10,790,636 B1
(45) Date of Patent: Sep. 29, 2020

(54) H-BRIDGE INTEGRATED LASER DRIVER

(71) Applicants: Karim Vincent Abdelhalim, Newport Coast, CA (US); Michael Q. Le, Laguna Niguel, CA (US)

(72) Inventors: Karim Vincent Abdelhalim, Newport Coast, CA (US); Michael Q. Le, Laguna Niguel, CA (US)

(73) Assignee: SITRUS TECHNOLOGY CORPORATION, Shanghai (CN)

( * ) Notice: Subject to any disclaimer, the term of this patent is extended or adjusted under 35 U.S.C. 154(b) by 0 days.

(21) Appl. No.: 16/874,464

(22) Filed: May 14, 2020

Related U.S. Application Data

(60) Provisional application No. 62/854,219, filed on May 29, 2019.

(51) Int. Cl.
*H01S 5/042* (2006.01)
*H03K 5/003* (2006.01)
*H03M 1/66* (2006.01)

(52) U.S. Cl.
CPC ........... *H01S 5/0427* (2013.01); *H03K 5/003* (2013.01); *H03M 1/66* (2013.01)

(58) Field of Classification Search
CPC ... H01S 5/0261; H01S 3/09702; H03K 5/003; H03M 1/66
See application file for complete search history.

(56) References Cited

U.S. PATENT DOCUMENTS 9,438,253 B2 * 9/2016 Erdogan ............... H03L 7/0807

* cited by examiner

*Primary Examiner* — Armando Rodriguez
(74) *Attorney, Agent, or Firm* — Burdick Patents, P.A.; Sean D. Burdick

(57) ABSTRACT

An H-bridge integrated laser driver optimizes power dissipation, impedance matching, low-swing and high-swing reliability for electro-absorption modulated laser (EML) and directly modulated laser diode (DML) applications. The laser driver includes a retimer for converting low-speed parallel data to a high-speed serial bit stream and to an inverted representation of the high-speed parallel bit stream, an M-bit PMOS DAC configured to receive a first buffered bit stream, an N-bit NMOS DAC configured to receive a second buffered bit stream substantially synchronized with the first buffered bit stream. A protective device is coupled between the M-bit DAC and the N-bit DAC. A first DC level-shifting predriver array is coupled between the retimer and the M-bit DAC to receive the high-speed parallel bit stream and the inverted high-speed parallel bit stream, and a second DC level-shifting predriver array is coupled between the retimer and the N-bit DAC to receive the high-speed parallel bit stream and the inverted high-speed parallel bit stream. An impedance matching module is coupled to an output of the protective device. The laser driver may be integrated on a CMOS communication chip.

24 Claims, 14 Drawing Sheets

H-BRIDGE INTEGRATED LASER DRIVER

RELATED APPLICATIONS

This application claims priority to U.S. Provisional Application 62/854,219 that was filed on May 29, 2019, and which is fully incorporated herein by reference. This application is related to U.S. patent application Ser. No. 16/855,945, which is also fully incorporated herein by reference.

BACKGROUND OF THE INVENTION

Field of the Invention

The present invention relates generally to digital communication systems, and more specifically to electronics architecture for an integrated laser driver for a CMOS PAM4 communication chip for electro-absorption modulated laser (EML) and directly modulated laser diode (DML) applications.

Description of Related Art

As Internet bandwidth demand increases and mobile phone connectivity advances to 5G, higher transmission speeds are needed for mobile data communications, particularly fiber-optic communications from cell towers to base stations, and within data centers for data center interconnects (DCI) and other inter-device communications. A conventional digital communication system uses an NRZ or PAM2 scheme to modulate signals so that bits of information are represented by one of two possible signal levels that correspond to a binary 0 or 1. To increase the bit rate, the PAM4 scheme has been proposed, to modulate signals so that bits are represented by one of four possible signal levels corresponding to binary 00, 01, 10 or 11. The PAM4 scheme thus effectively doubles the bit rate in serial data transmissions by increasing the number of levels of pulse-amplitude modulation, but it does so at the cost of noise susceptibility, with signal-to-noise ratios dropping by a factor of about two thirds.

A high-speed optical PAM4 system transmitting, e.g., at 56 Gb/s therefore requires complex digital signal processing (DSP) to enable operation in circuits having lower signal-to-noise ratios. Practical implementation of such as system is made possible only by modern CMOS technology due to integration, cost, and power constraints. Advanced design in this field envisions the integration of a PAM4 laser driver on a CMOS chip.

Integrating the PAM4 laser driver on the PAM4 DSP chip would advantageously reduce power dissipation, lower the overall material costs, and reduce the size of the laser module. However, laser drivers for EML and DML applications require high currents (up to 60 mA) and a typical high voltage swing of up to 2.2V peak-to-peak single-ended (ppse), while achieving high-speed (>10 GHz) and high linearity for PAM4 schemes. Due to these high-swing and high-current requirements, it is very difficult to implement the laser driver in a modern CMOS technology that is required to achieve high-speed performance without suffering overstress and reliability concerns. A modern core-device MOSFET, for example, can only tolerate approximately 1V across all its terminals (VGS, VGD and VDS). For these reasons, the laser driver is more commonly implemented in non-CMOS technologies such as Silicon-Germanium (SiGE) and Indium Phosphide (InP) heterostructure bipolar transistor (HBT) technologies, as an external (i.e. non-integrated) driver. Such an implementation is shown in the typical PAM4 optical system 10 of FIG. 1. In system 10, the PAM4 communication chip 11 receives incoming signals from an external transimpedance amplifier 13, and transmits output signals to a non-integrated laser driver 15. The laser driver 15 is an external chip electrically coupled to communication chip 11.

The typical PAM4 optical system with an external driver requires the PAM4 communication IC to provide a signal having up to 1V peak-to-peak differential (ppd) swing into a 100-ohm system (measured differentially), which is then sent either as a single-ended 1.5Vpp into a 50-Ohm load for EML or differentially with up to 60 mA of modulation current into a <25-ohm load for DML. It would be more efficient in terms of bandwidth, power dissipation, and linearity to avoid two stages of PAM4 transmission by integrating the laser driver directly into the PAM4 IC to drive either an EML or DML. Two known methods for implementing a high-speed transmitter driver are a current-mode driver (CML) and a voltage-mode driver (SST).

One limitation of using CML to implement an optical driver is its low-current efficiency where the differential swing is determined by [Current/2]×[Rdiff]. To provide 1.5Vppse, the CML driver would require 60 mA of current. Furthermore, for single-ended applications it is difficult to ensure the impedance looking towards the supply (when swinging high) and impedance looking towards GND (when swinging low) are well matched unless the supply is very high. This asymmetry results in poor linearity and failure to meet PAM4 transmitter specifications. Nor does increasing the supply solve the problem, as it generally results in overstress and poor reliability, as well as very high power dissipation.

An SST driver can achieve the same swing as the CML driver with about 75% less power consumption; however, there are two issues with using an SST that make it difficult to implement in an integrated PAM4 laser driver. The main issue is reliability. When the swing is >1Vppse, the VDS of the devices becomes overstressed. It is difficult to place protective features such as a cascode device to protect an SST driver, as it uses switches having very low impedance to implement the targeted output impedance. The second issue is the difficulty in implementing different output impedances needed for different applications, such as 25-ohm for DML and 50-ohm for EML. To provide this flexibility would require significant redesigning of the conventional SST driver. At the low 25-ohm impedance the size of the NMOS and PMOS devices would need to be scaled significantly to minimize their impedance, and this would increase the power dissipation of the predriver stage and add significant parasitic capacitance to the driver.

What is needed is an advancement in laser driver design for PAM4 modulation that can be integrated on a CMOS communication chip and that optimizes power dissipation, output impedance matching, and low-swing and high-swing reliability for both EML and DML applications.

SUMMARY OF THE INVENTION

The foregoing objectives are achieved by apparatus and methods according to the invention that embody an integrated laser driver in an NRZ/PAM4 CMOS communications chip suitable for EML and DML applications. In general, the invention employs a modified H-bridge architecture as a current mode driver. The driver circuit includes two digital-to-analog converters (DACs)—an NMOS DAC and a PMOS DAC—cascode protection, common mode feedback (CMFB), dual rail predrivers, on-chip termination and a T-coil. An optional DC bias may be added for biasing the laser device.

In one embodiment, an H-bridge integrated laser driver according to the invention includes multiple stages or elements: A retimer element is configured to convert low-speed parallel data to a first, high-speed serial bit stream and to an inverted representation of the high-speed parallel bit stream. An M-bit PMOS DAC is configured to receive a first buffered bit stream, and an N-bit NMOS DAC configured to receive a second buffered bit stream. A protective device, such as a cascode stage, is coupled between the M-bit DAC and the N-bit DAC. A first DC level-shifted predriver array is coupled between the retimer and the M-bit DAC for receiving the high-speed parallel bit stream and the inverted high-speed parallel bit stream. A second DC level-shifter predriver array is coupled between the retimer and the N-bit DAC for receiving the high-speed parallel bit stream and the inverted high-speed parallel bit stream. Additionally, an impedance matching module is coupled to the output of the cascode stage. The foregoing elements are further configured so that the first buffered bit stream is substantially synchronized with the second buffered bit stream. In one embodiment, the first buffered bit stream and the second buffered bit stream are substantially identical.

Many other elaborations on the invention are also presented herein. In one embodiment, the retimer may comprise a serializer. In other embodiments, M may be set equal to N, or M may be set to one. In other implementations of the invention, signal inversion may be made to occur at the input to predriver arrays, or at the output from the predriver arrays. The protective device may be configured to limit |VGD|, |VGS| and |VDS| to less than a breakdown voltage of the PMOS DAC, or alternatively, to less than a breakdown voltage of the NMOS DAC. In another embodiment, the protective stage is configured to reduce capacitance at the output of the laser driver. In further embodiments, the impedance matching module may be configured to match the impedance of a 25-ohm system, or a 50-ohm system, or any impedance system. The impedance matching module may also include a resistor coupled across differential terminals of the laser driver. Alternatively or in addition, the impedance matching module may include a T-coil or inductor coupled between the on-chip impedance and the driver output terminal. Alternatively, the impedance matching module may include a center tap between the driver's differential terminals, resistors coupled between each differential terminal and the center tap, and an AC grounding capacitor coupled to the center tap. In the latter embodiment, a T-coil or inductor may be coupled between each resistor and the driver output, to improve high-frequency impedance matching and output bandwidth.

Any of the various embodiment of a laser driver according to the invention may be implemented as a driver for a DML, for example, a DML formed as a transmitter optical sub-assembly. The laser driver may operate as a single-ended driver or as differential driver for an NMOS or PMOS bias circuit. Methods for manufacturing a laser driver and associated components according to configurations described herein as an integrated circuit for a CMOS PAM4 communication chip are also disclosed.

BRIEF DESCRIPTION OF THE DRAWINGS

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims. Component parts shown in the drawings are not necessarily to scale, and may be exaggerated to better illustrate the important features of the invention. Dimensions shown are exemplary only. In the drawings, like reference numerals may designate like parts throughout the different views, wherein:

DETAILED DESCRIPTION OF THE INVENTION

The following disclosure presents apparatus and methods of the present invention that embody an integrated laser driver in an NRZ/PAM4 CMOS communications chip suitable for EML and DML applications. While embodiments described herein illustrate the invention in a PAM4 optical communication application, it should be understood that the principles of the invention may apply equally to communication systems that use hard-wired (e.g. copper) transmission lines, and to systems that convert NRZ or PAM2 modulation schemes to PAM4 modulation. In general, the invention employs a modified H-bridge architecture as a current mode driver. The driver circuit includes two digitalto-analog converters (DACs)—an NMOS DAC and a PMOS DAC—cascode protection, common mode feedback (CMFB), dual rail predrivers, on-chip termination and a T-coil. An optional DC bias may be added for biasing the laser device. Circuit elements described herein and shown on the accompanying drawings may be fabricated on one or more integrated circuit chips using techniques known in the art.

Figure 1:
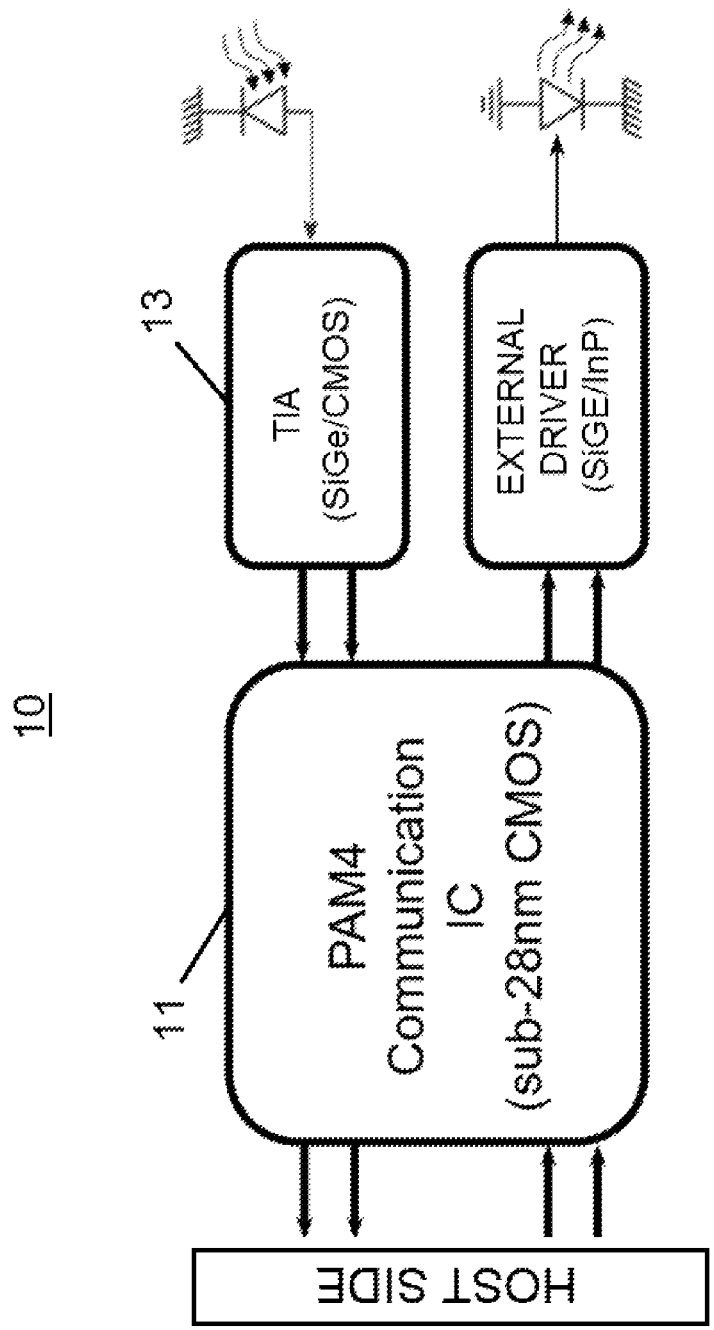
FIG. 1 is a top-level block diagram of a conventional PAM4 communication system showing a driver module coupled externally to the PAM4 communication chip.
Figure 2:
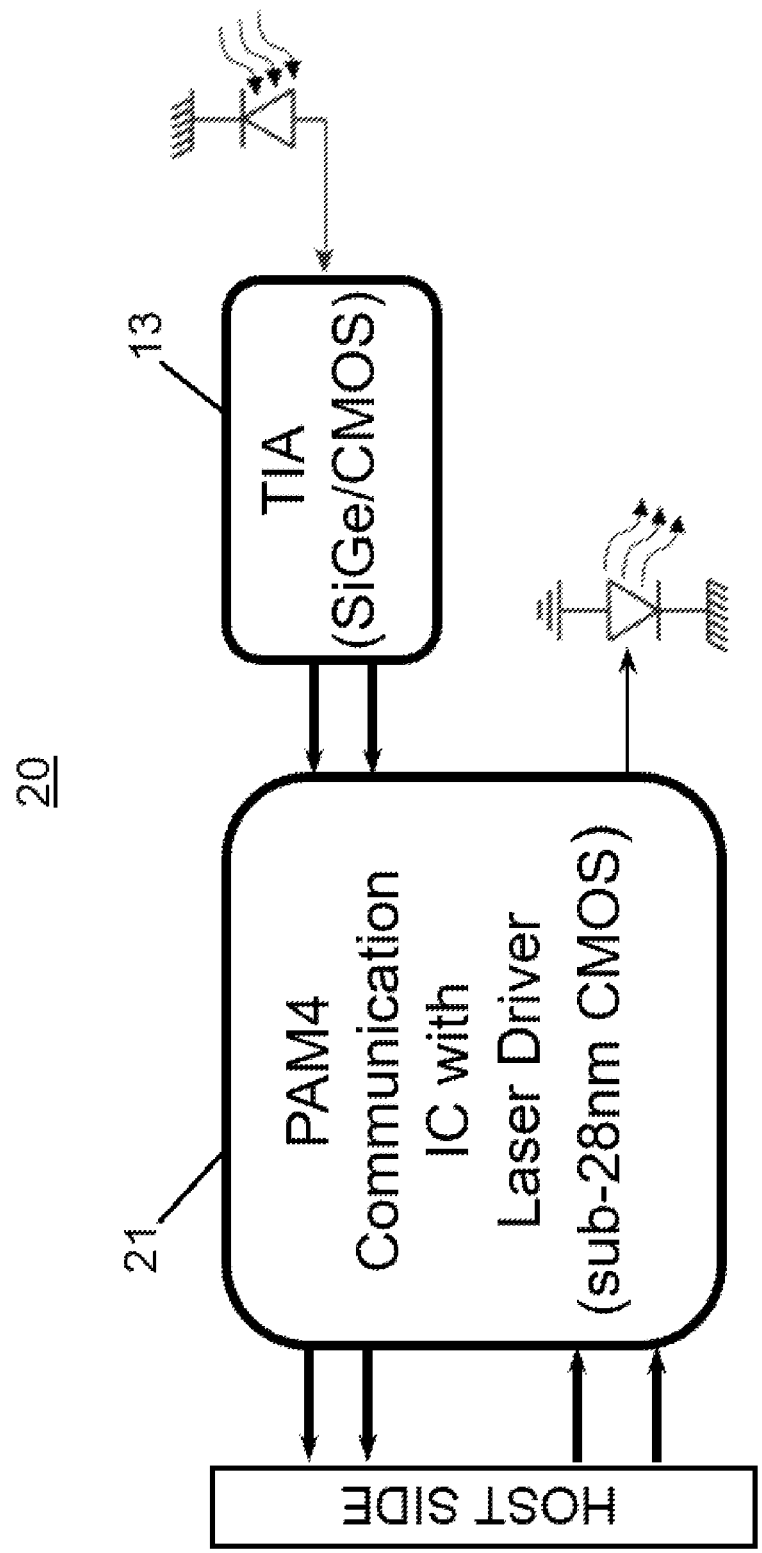
FIG. 2 is a top-level block diagram of one embodiment of a system according to the present invention for an advanced PAM4 communication system having a PAM4 communication chip with an integrated laser driver.

The following glossary of acronyms used herein is provided as a quick-reference guide to facilitate understanding of the present disclosure:

5G—fifth-generation wireless cellular technology
AB—class AB amplifier
BW—bandwidth
CML—current-mode logic, herein denoting a current-mode logic driver
CMFB—common mode feedback
CMOS—complimentary metal-oxide semiconductor
DAC—digital-to-analog converter
DCI—data center interconnects
DFF—delay flip-flop
DML—directly modulated laser diode
DSP—digital signal processing
EML—electro-absorption modulated laser
ESD—electrostatic discharge
FFE—feed forward equalizer
FIR—finite impulse response
GND—ground
HBT—heterostructure bipolar transistor
IC—integrated circuit
InP—Indium Phosphide
MOSFET—metal-oxide-semiconductor field effect transistor
NMOS—n-type metal-oxide semiconductor
NRZ—non-return-to-zero
OTA—operational transconductance amplifier
PAM4—four-level pulse amplitude modulation
PAM2—two-level pulse amplitude modulation
PMOS—p-type metal-oxide semiconductor
pp—peak-to-peak
ppd—peak-to-peak differential
ppse—peak-to-peak single-ended
Rdiff—differential resistance
SiGE—Silicon-Germanium
SST—source-series terminated, herein denoting a voltage-mode driver
T-line—transmission line
TOSA—transmitter optical sub-assembly
VDD—positive supply voltage
VDS—drain-to-source voltage
VGD—gate-to-drain voltage
VDS—drain-to-source voltage FIG. 2 shows a top-level block diagram of one embodiment of a system 20 according to the present invention for advanced PAM4 communication. The system is characterized by having a PAM4 communication chip 21 with an integrated laser driver. The integrated laser driver portion of the chip is described in further detail herein. According to the invention, integration of the laser driver into the PAM4 communication chip 21 reduces the overall bill of materials (BoM) cost by eliminating the external driver chip 15.

Figure 3:
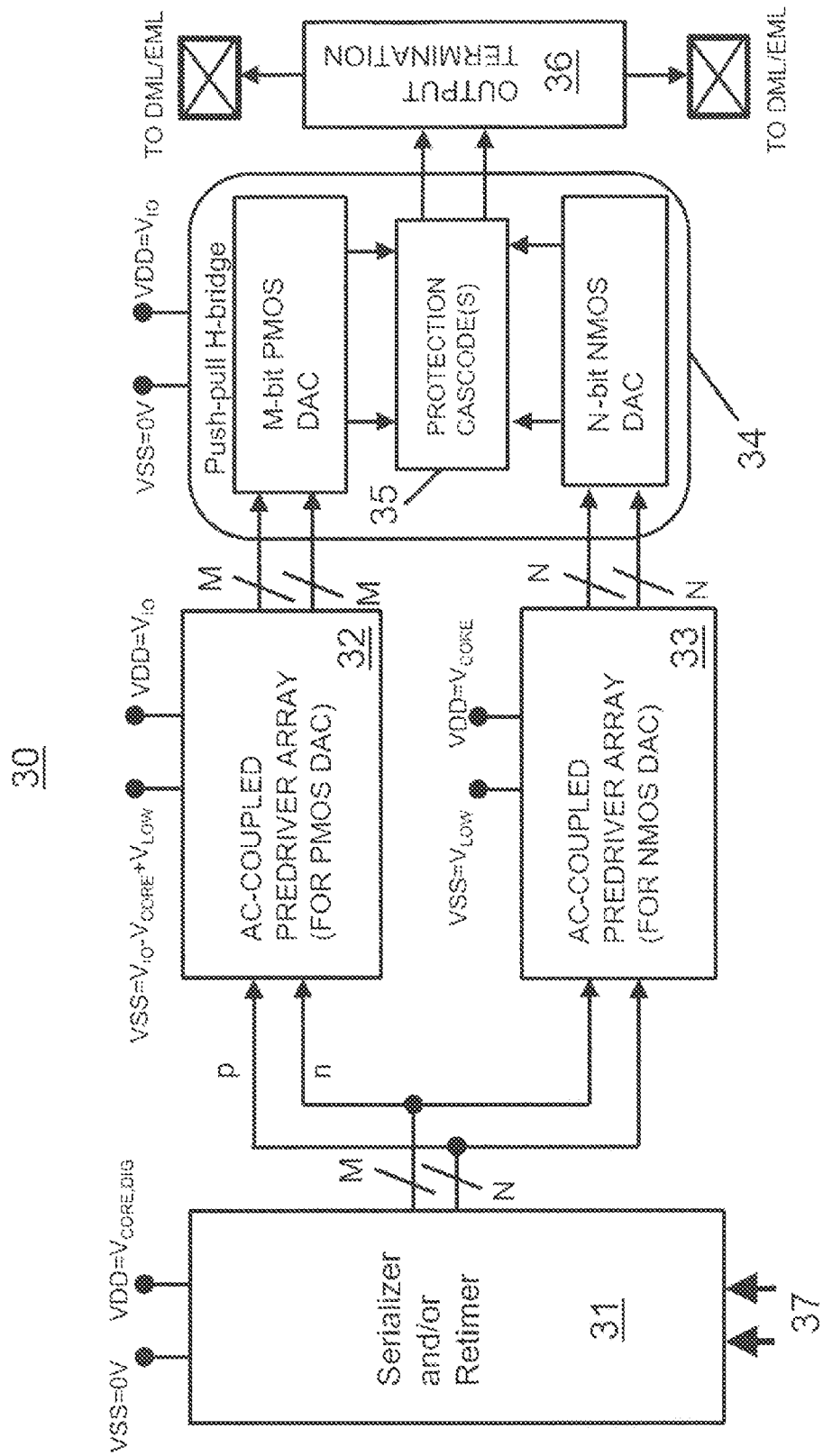
FIG. 3 is a block diagram of one embodiment according to the invention of an H-bridge integrated laser driver.

FIG. 3 shows a block diagram of one embodiment according to the invention of an H-bridge integrated laser driver 30 that is suitable for PAM4 implementations. In this embodiment, the integrated PAM4 laser driver 30 includes: an optional serializer 31 for converting low-speed parallel data to high-speed serial data, two copies of timing matched identical predriver arrays 32 and 33, a push-pull H-bridge 34 that includes an M-bit PMOS DAC and an N-bit NMOS DAC, an optional protective device 35, and an output termination stage 36 for impedance trim with optional common mode feedback (CMFB) and bandwidth (BW) enhancement. In one embodiment, M=N. Predriver arrays 32, 33 may be provided with different supply rails. For example, a first supply rail [VSS=$V_{IO}$-$V_{CORE}$+$V_{LOW}$; VDD=$V_{IO}$] may be provided to predriver array 32 that interfaces to the PMOS DAC, and a second supply rail [VSS=$V_{LOW}$; VDD=Vcore] may be provided to predriver array 33 that interfaces to the NMOS DAC. Predriver arrays 32, 33 may be configured as DC level-shifting predriver arrays that amplify the voltage level of output signals transmitted to H-bridge 34. Examples of such DC shifting predrivers are disclosed in co-pending U.S. patent application Ser. No. 16/855,945 which is fully incorporated herein by reference. In an alternative embodiment, H-bridge 34 may be a single driver instead of a DAC (i.e. M=1). In another embodiment, the protective device 35 may be implemented as a cascode stage.

In a preferred mode of operation of the H-bridge integrated laser driver 30, parallel data 37 is received by the serializer 31 from an on-chip digital core or digital signal processor (DSP) that is integrated on the same chip as the laser driver 30. For optimum power dissipation the digital core may operate around 500 MHz-2 GHz in sub-28 nm CMOS technologies. The serializer 31 converts the lower-speed parallel data to a higher-speed serial stream. In one exemplary embodiment, serializer 31 converts 32×1 Gbps× M-bits parallel data to a 1×32 Gbps×M-bits data stream.

Figure 4:
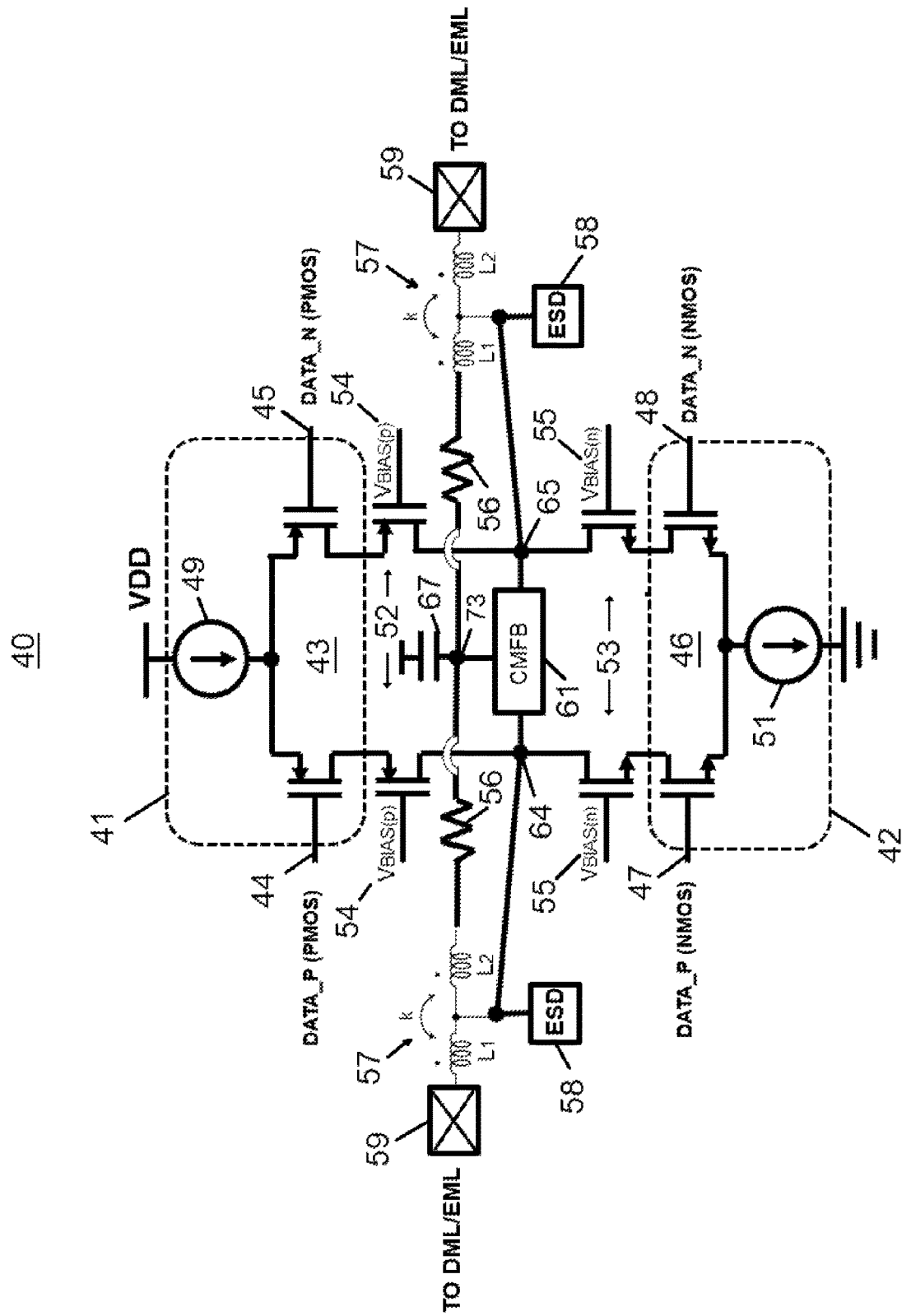
FIG. 4 is a circuit diagram of one implementation according to the invention of an H-bridge integrated laser driver.

FIG. 4 shows a circuit diagram of one implementation according to the invention of an H-bridge integrated laser driver 40. Laser driver 40 is characterized by a PMOS M-bit current steering DAC 41 coupled in push-pull configuration with an NMOS M-bit current steering DAC 42. M-bit DAC 41 includes a PMOS switching stage 43 controlled by the binary DATA_P (PMOS) and DATA_N (PMOS) at the input gates of 44 and 45. M-bit DAC 42 includes an NMOS switching stage 46 controlled by the binary DATA_P (PMOS) and DATA_N (NMOS) at the input gates of 47 and 48. In one embodiment, DACs 41 and 42 are configured to have equal output impedance and/or equal loading. A PMOS current source 49 provides a desired current from the positive supply VDD. Similarly, an NMOS current source 51 provides a desired current source to ground. Preferably these desired currents 49, 51 are equal. In other embodiments of the invention, additional current sources (commonly referred to as current bleeders) can be connected to the drain of the switching devices 43, 46 to improve the bandwidth and performance of the driver at the expense of extra power dissipation. For example, such optional current bleeders would be modeled as a current source connected from VDD for the PMOS DAC 41, and a current source connected to GND for the NMOS DAC 42. Generally, the output impedance looking into the PMOS side and NMOS side at node 73 should be matched for optimum performance.

A first cascode stage 52 may be used as protective device to limit overstress at PMOS switching stage 43. Cascode stage 52 may also be configured to isolate the total capacitance at the output of the drain node of the switching device 43. Similarly, a second cascode stage 53 may be used to limit overstress at NMOS switching stage 46 and isolate total capacitance at the output of the drain node of the switching device 46. A bias voltage 54 or 55 at the gate of each cascode ensures high reliability and performance. Resistors 56 provide on-chip termination to match system impedance and minimize reflections. In exemplary embodiments, resistors 56 may be 50 ohms or 25 ohms. Optional on-chip T-coils 57 may be connected, as shown, to extend the bandwidth of the driver and improve return loss. In this example, for optimum group delay, return loss and transmitter bandwidth a T-coil 57 is connected between resistor 56 and the output of the driver at 59 with the center-tap of the T-coil connected via node 64 or 65 to shield the output capacitance of the cascode device and the electrostatic discharge (ESD) load 58. An optional common-mode capacitor 61 may be included to provide an AC ground.

As disclosed herein, by ensuring equal PMOS and NMOS impedances, the single-ended configuration has a symmetrical response for high swing. Advantageously, the H-bridge or push-pull configuration requires only half the current that is required by a CML driver to achieve the same swing. Preferably, the same number of bits are input to the PMOS and NMOS DACs 41, 42. In operation, however, different numbers of bits may be input to the PMOS and NMOS DACs. An optional CMFB circuit 61 ensures the DC voltage is set to a fixed value (e.g. VDD/2) to maximize voltage headroom and provide greater tolerance for device mismatch. In another embodiment, cascode devices 52, 53 may comprise multiple cascode stages by stacking more than one NMOS or PMOS cascode device. Generally, more cascode devices enable higher voltage swings without loss of reliability.

Figure 5:
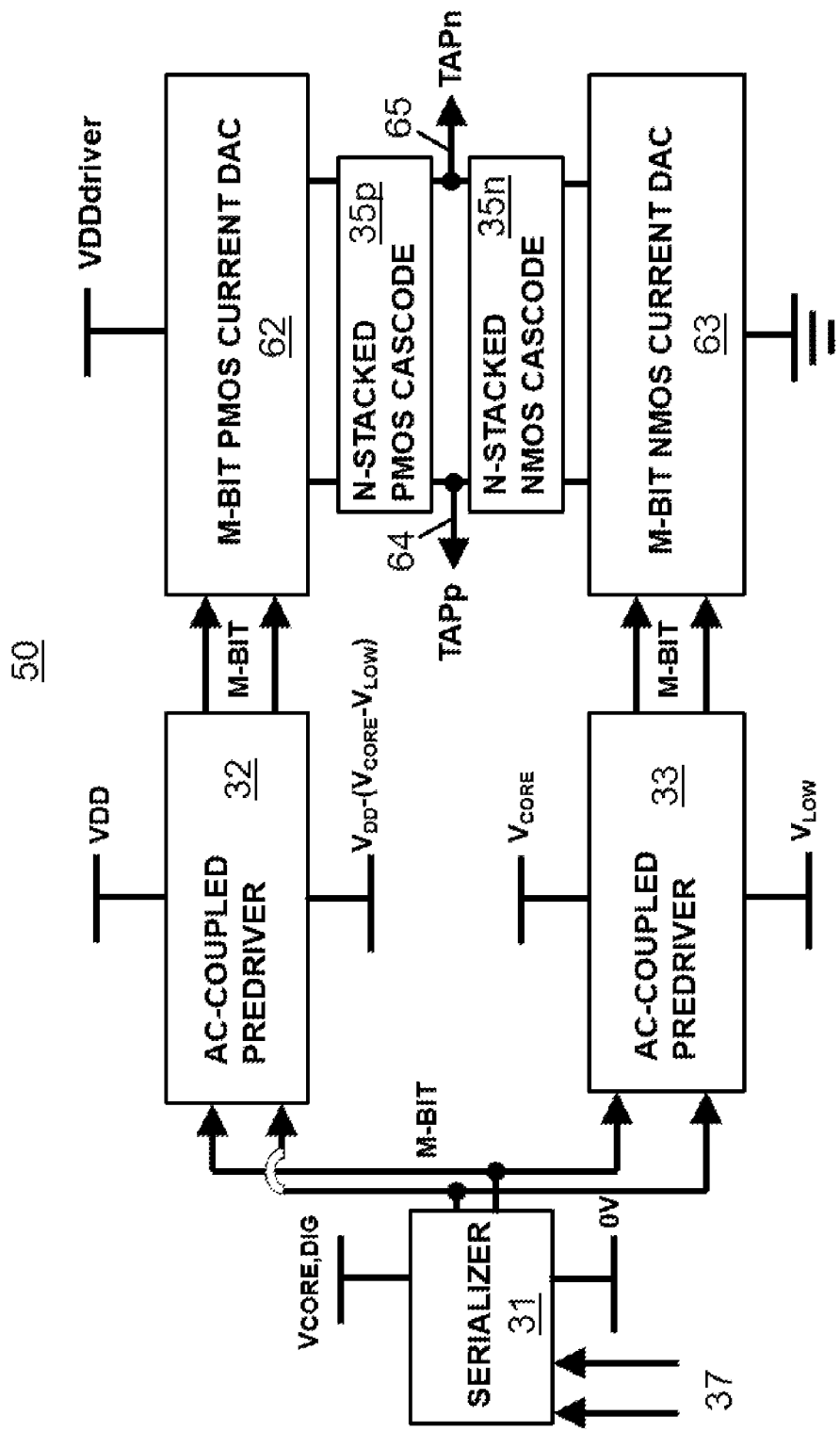
FIG. 5 is a block diagram of one embodiment according to the invention of an H-bridge integrated laser driver.

FIG. 5 shows a block diagram of one embodiment according to the invention of an H-bridge integrated laser driver 50. In this embodiment, M-bit PMOS and NMOS DACs 62 and 63 are matched in size, so that timing between the serializer 31 and the DACs is also matched. Identical predriver arrays 32, 33 have substantially the same level of supply voltage ($V_{CORE}$–$V_{LOW}$) to achieve a timing match and to enable the arrays to properly interface with the PMOS/NMOS DACs arrays 62, 63. N-stacked (usually N=1 or 2) cascode stages 35$p$, 35$n$ are provided to protect each DAC from overstress, and the PMOS/NMOS pair [62 & 35$p$, 63 & 35$n$] is preferably configured to have matched output impedances for single-ended performance.

Figure 6:
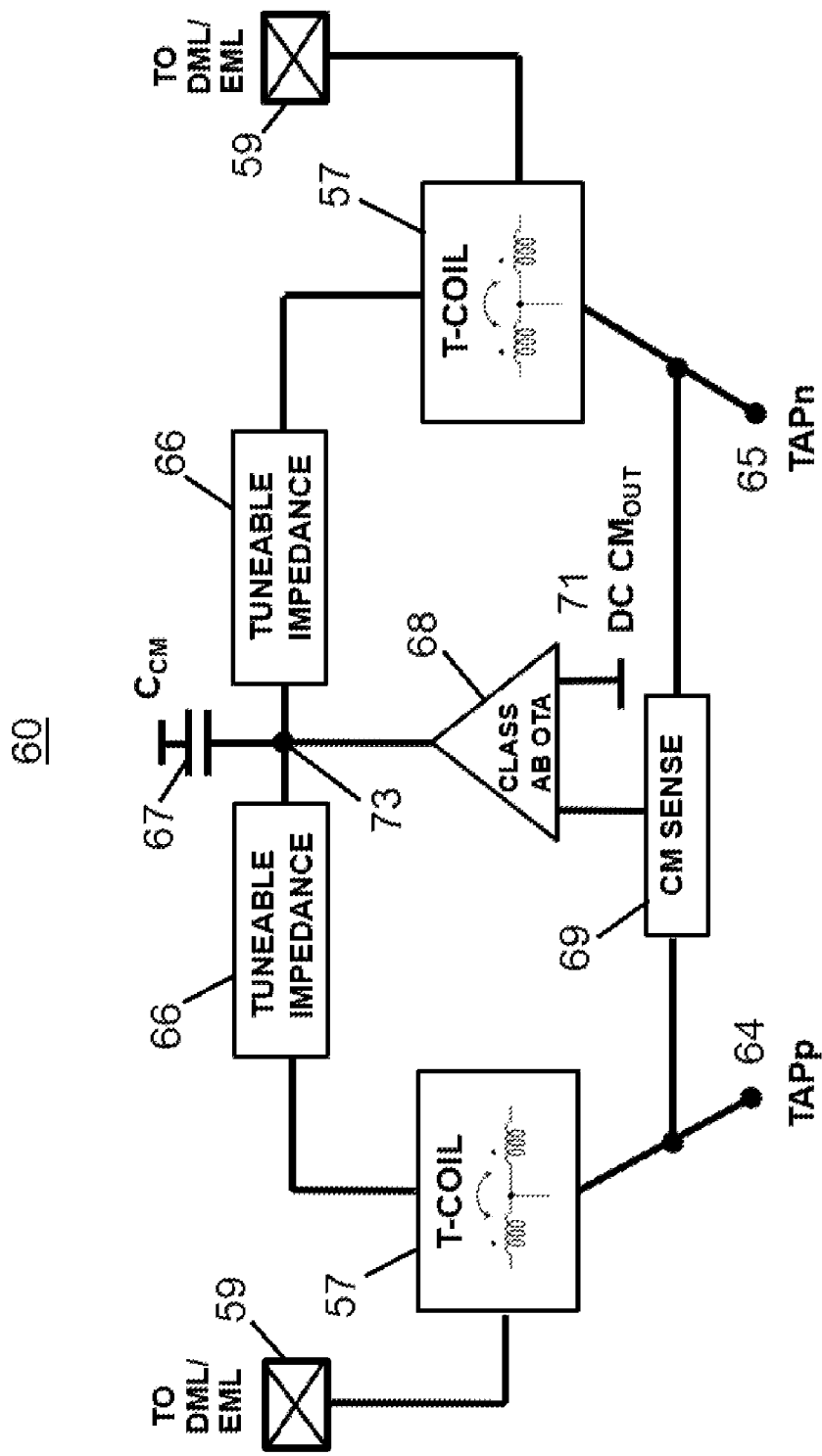
FIG. 6 is a block diagram of one embodiment according to the invention of an output termination stage that uses common mode feedback to set the DC output.

FIG. 6 shows a block diagram of one embodiment according to the invention of an output termination stage 60 that uses common mode feedback to set the DC output. The output termination has a tunable impedance 66 for either EML (50-ohm) or DML (<25-ohm) applications. Optional common-mode capacitance $C_{CM}$ 67 can be added for single-ended impedance termination at low frequency (<1 GHz) by providing an AC-ground. A CMFB loop utilizing a Class AB OTA 68 to save power dissipation is utilized to keep the output common-mode (CM) of the driver set to an ideal CM output, typically about $VDD_{DRIVER}/2$. CM sense, 69, is generally configured as a resistor divider to sense the CM from the differential output. A negative feedback loop is formed by coupling OTA 68 between node 69 and reference voltage (e.g. $V_{DD}/2$). The H-bridge center tap node, 73, gets forced through negative feedback to (TAPp+TAPn)/2 equal to DC $CM_{OUT}$ 71.

Figure 7:
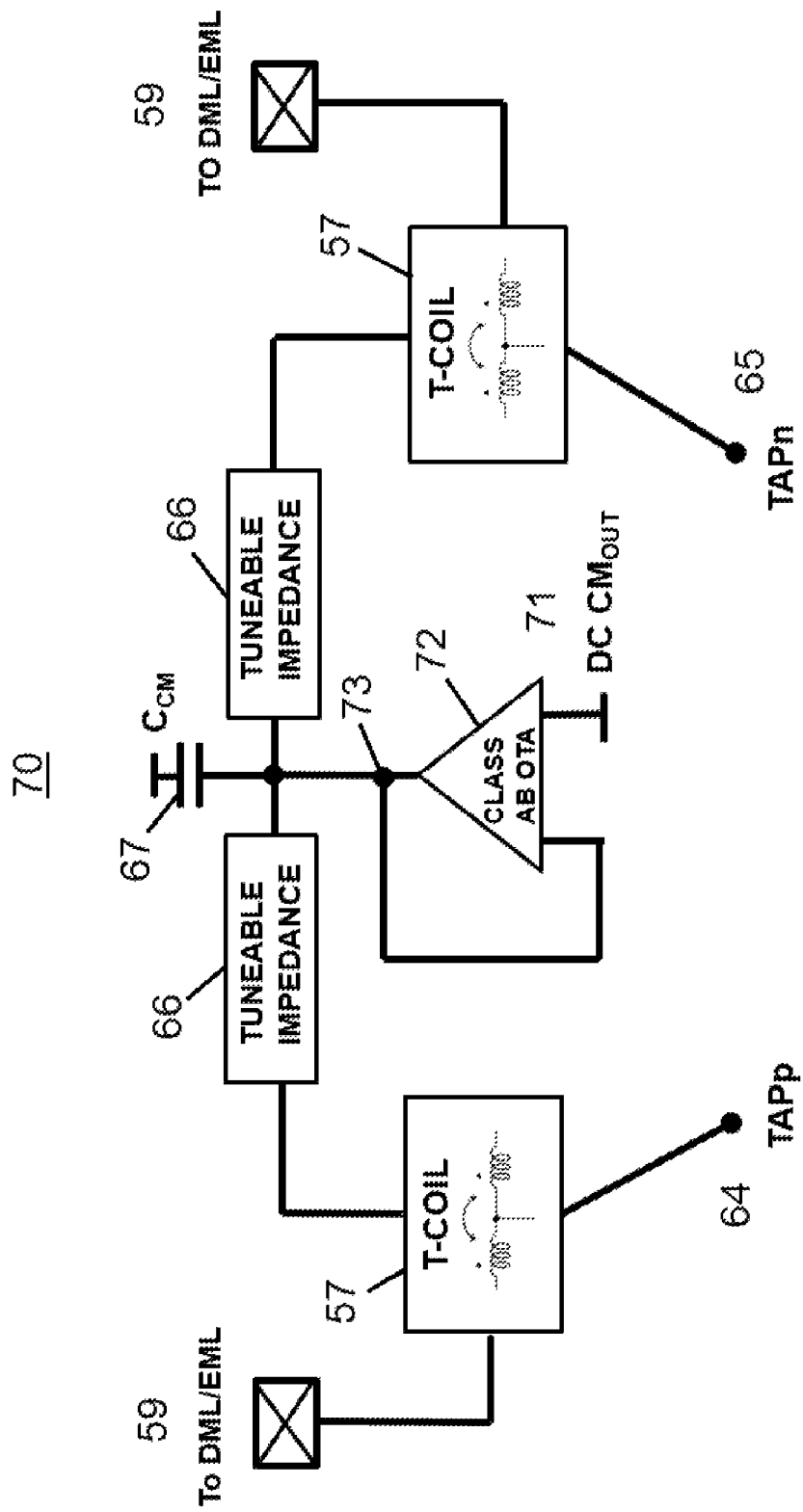
FIG. 7 is a block diagram of another embodiment according to the invention of an output termination stage that uses a class AB buffer to set DC output.

FIG. 7 shows a block diagram of another embodiment according to the invention of an output termination stage 70. Termination stage 70 uses a class AB OTA 72 configured as a unity-gain buffer to set DC output, instead of common-mode feedback. Configuring the class AB OTA 72 in this manner ensures that the DC CM level is approximately set. This configuration may improve phase margin and may provide a lower single-ended termination at low frequencies. Moreover, by configuring the OTA 72 as a unity-gain buffer, the H-bridge center tap node 73 (connected to $C_{CM}$ 67) is forced to be equal to DC $CM_{OUT}$. This advantageously creates a low-frequency single-ended impedance. Similarly, usage of a class AB OTA reduces power dissipation.

Figure 8:
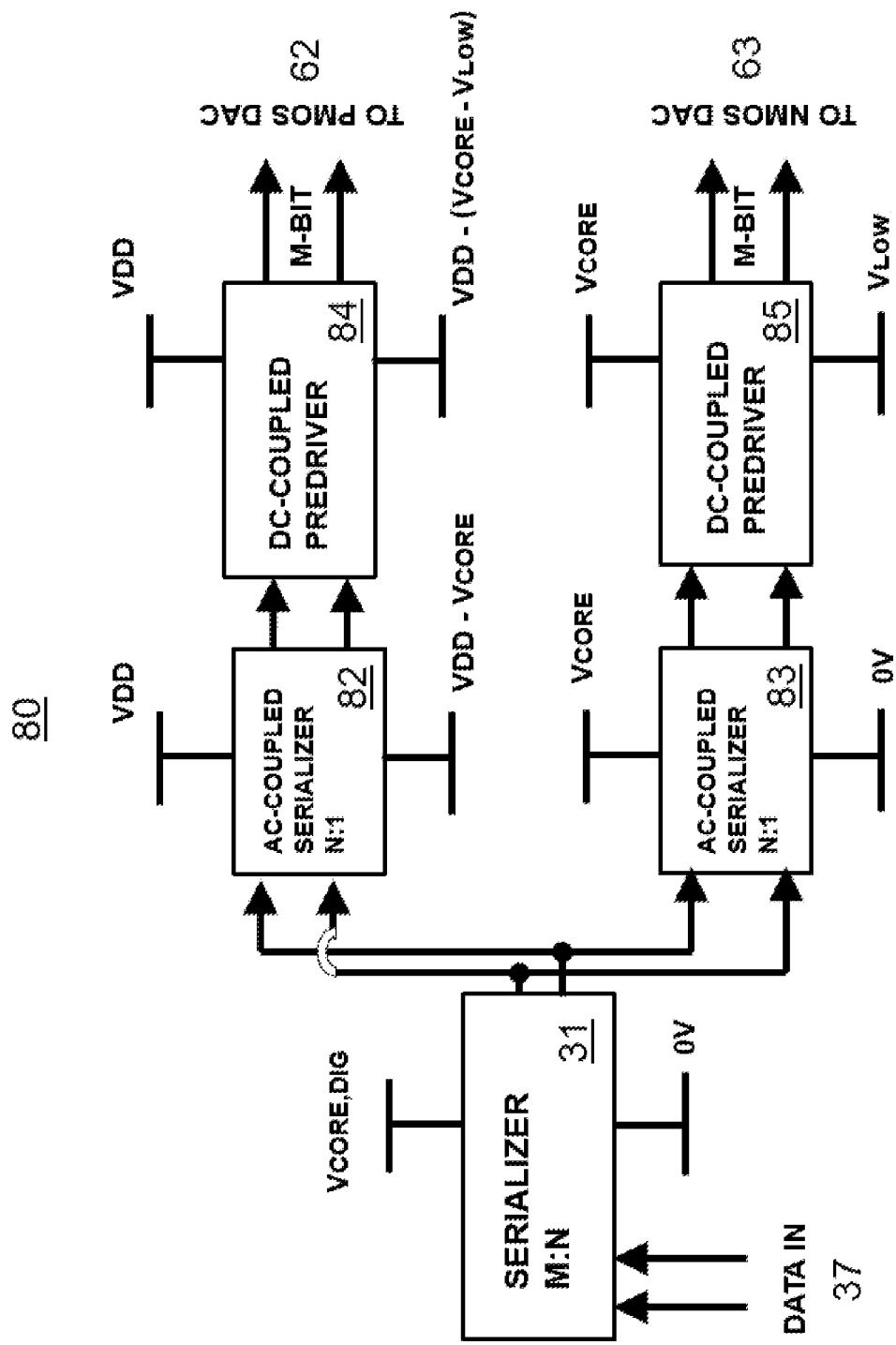
FIG. 8 is a block diagram of an alternative embodiment according to the invention of an H-bridge integrated laser driver configured for AC coupling at lower speed.

FIG. 8 shows a block diagram of an alternative embodiment according to the invention of an H-bridge integrated laser driver 80. In this embodiment, the AC-coupling is configured for lower-speed operation. Here, the AC-coupled buffer operates at a lower frequency (Fs/N) data-rate instead of operating at the full data-rate (Fs) as in the case of the AC-coupled buffer 32, 33. After the AC-coupling, the data is serialized by two duplicate serializers 82, 83. After the serializer, predrivers 84, 85 interface between 82 and 62, and between 83 and 63, for PMOS and NMOS, respectively. This configuration may, however, require more power dissipation as there are more circuits connected to the higher VDD supply, which make the laser driver more susceptible to a timing mismatch between the NMOS and PMOS DACs.

Figure 9:
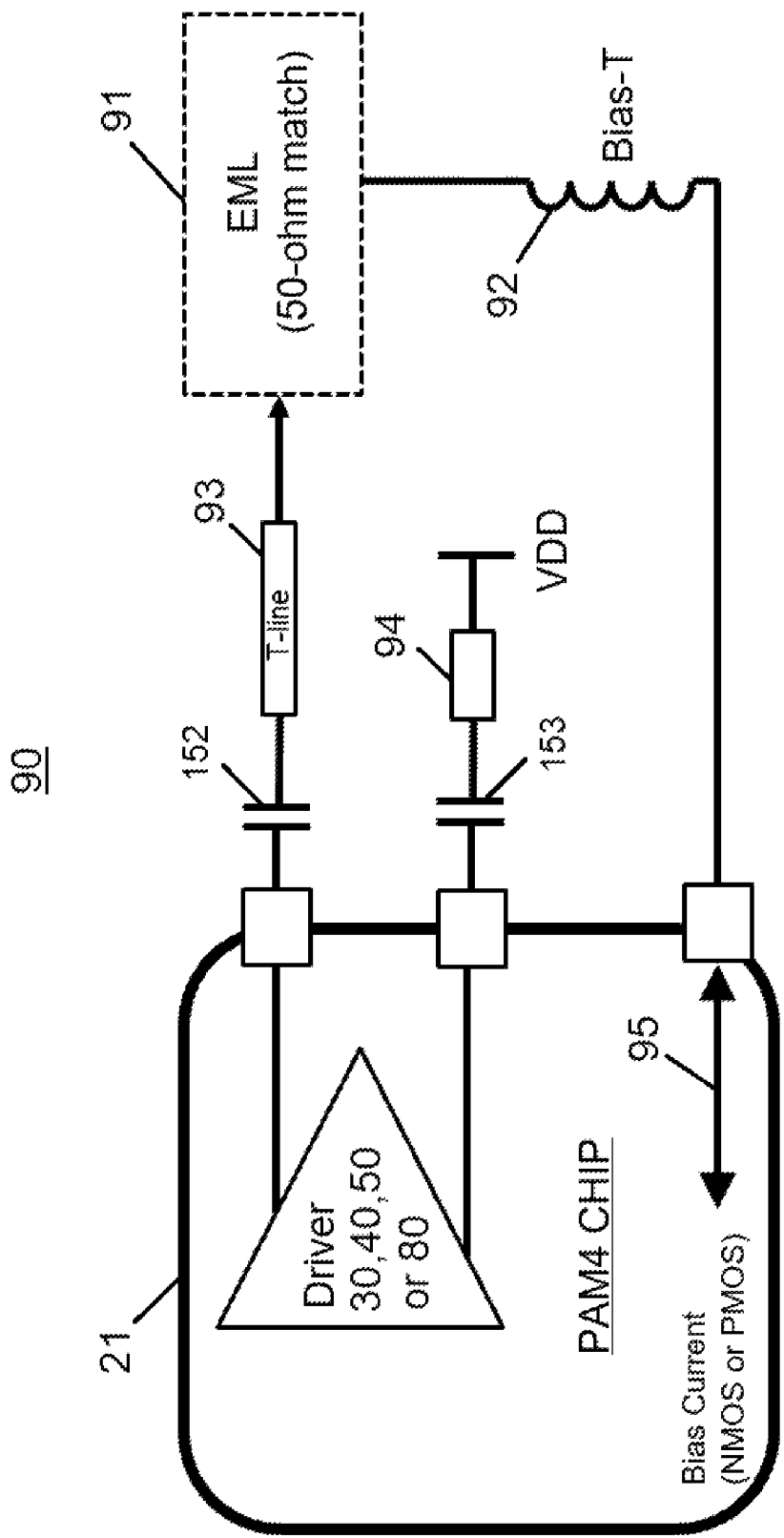
FIG. 9 is a block diagram of an exemplary application for the present invention as a driver for an EML single-ended 50-ohm system.

FIG. 9 shows a block diagram of an exemplary application 90 for the present invention as a laser driver 30, 40, 50 or 80 for an EML 50-ohm system 91. This scheme implements a PAM4 communication chip 21 with an integrated laser driver to drive EML single-ended into a 50-ohm impedance with voltage swings up to the practical EML voltage limit, for example, 2Vpp single-ended. An optional bias-T 92 may be provided with either NMOS or PMOS bias current 95. A short impedance-matched transmission line 93 may be implemented on a printed circuit board (PCB) to minimize reflections and insertion loss between the PAM4 chip 21 and the EML 91. In this embodiment and the embodiments that follow, the Bias-T 92 can be integrated into the PAM4 chip 21 itself or the PAM4 chip 21 package. Bias-T 92 is configured to block AC signals and to pass only DC bias current 95. An optional dummy load 94, for example, a 50-ohm load, may be connected to terminate and balance the unused side of the driver. Optional AC-coupling capacitors 152 and 153 may be added to isolate the DC CM of the driver and the laser.

Figure 10:
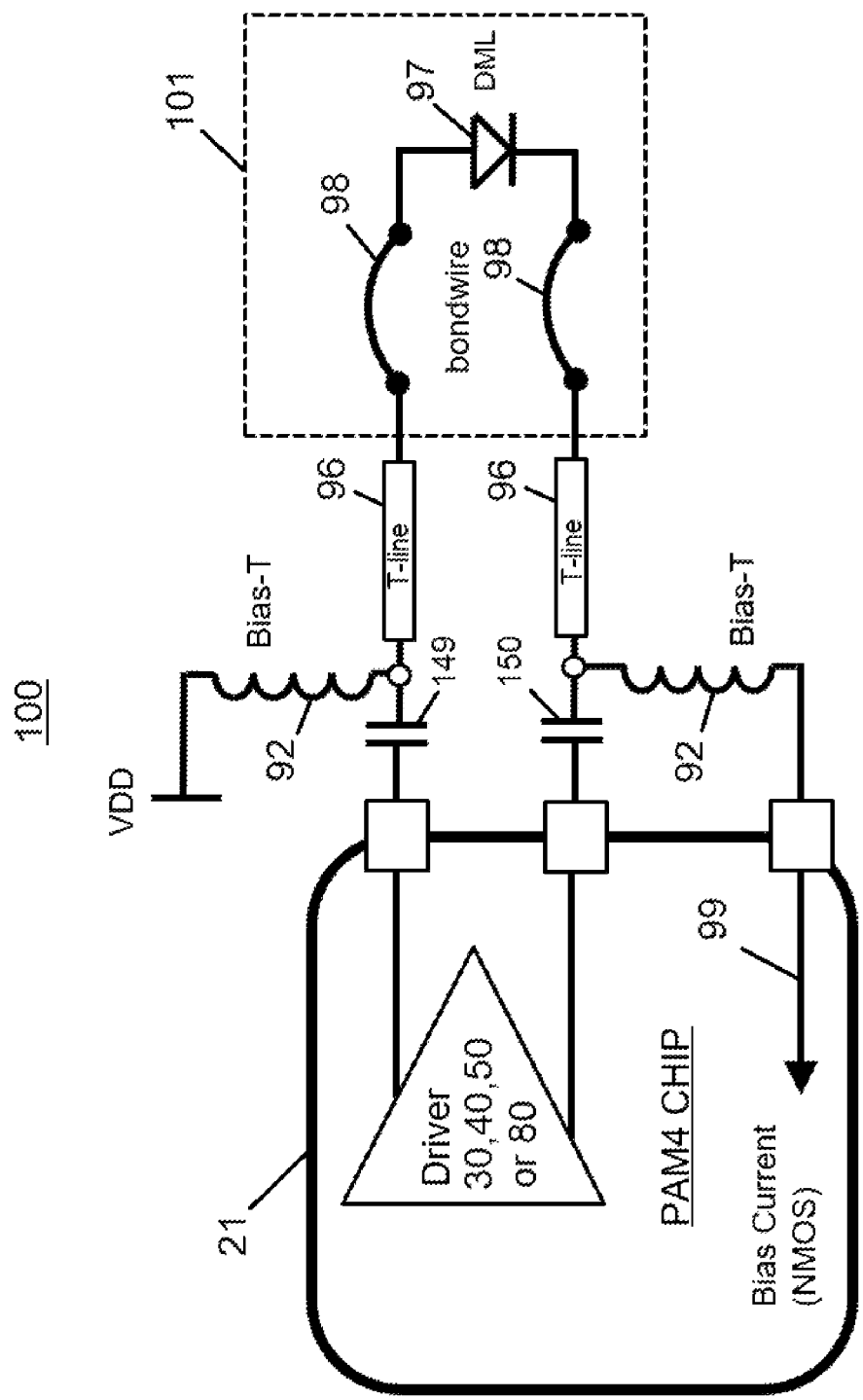
FIG. 10 is a block diagram of an exemplary application for the present invention as a driver with an NMOS bias circuit in a differential DML system.

FIG. 10 shows a block diagram of an exemplary differential implementation 100 for the present invention as a laser driver 30, 40, 50 or 80 for an NMOS circuit in a DML system 101. Typically, DML system 101 is implemented as a transmitter optical sub-assembly (TOSA). The differential implementation may be optionally AC-coupled through capacitors 149 and 150 to a short differential impedance-matched transmission line 96 implemented on a printed circuit board (PCB). Transmission line 96 is generally rated as a 50-ohm differential (25-ohm single-ended) impedance or a 100-ohm differential (50-ohm single-ended) impedance. The load in this implementation is a differential DML laser 97, often having an impedance between 10-ohms differential and 50-ohms differential. Specifically, the DML laser 97 is provided on a TOSA that is connected to transmission line 96 through bond-wire 98. Bias current 99 may be connected through a bias-T 92 to provide a laser bias current to the DML driver from a voltage source, as shown, and another bias-T 92 may be connected to a supply voltage VDD. In another embodiment, the bias-T 92 connections may be made on the right-hand side of the transmission line 96 and directly to the TOSA.

Figure 11:
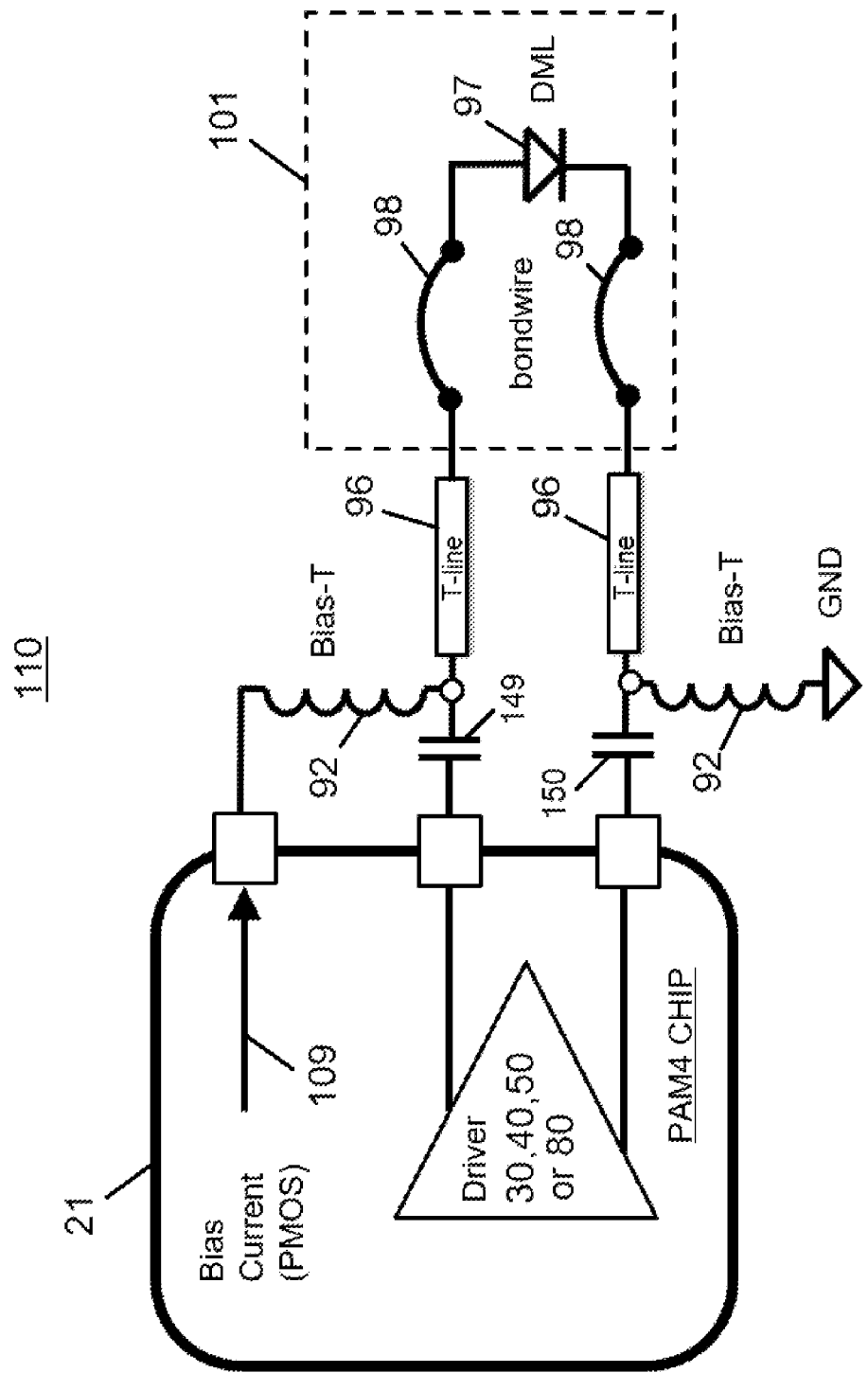
FIG. 11 is a block diagram of another exemplary application for the present invention as a driver with a PMOS bias circuit in a differential DML system.

FIG. 11 shows a block diagram of another exemplary implementation 110 for the present invention as a driver 30, 40, 50 or 80 for a PMOS bias circuit in a DML system 101. This implementation 110 is operationally similar to the prior implementation 100, except that here, the bias current 109 is sent to GND rather than being sourced from the supply voltage.

Figure 12:
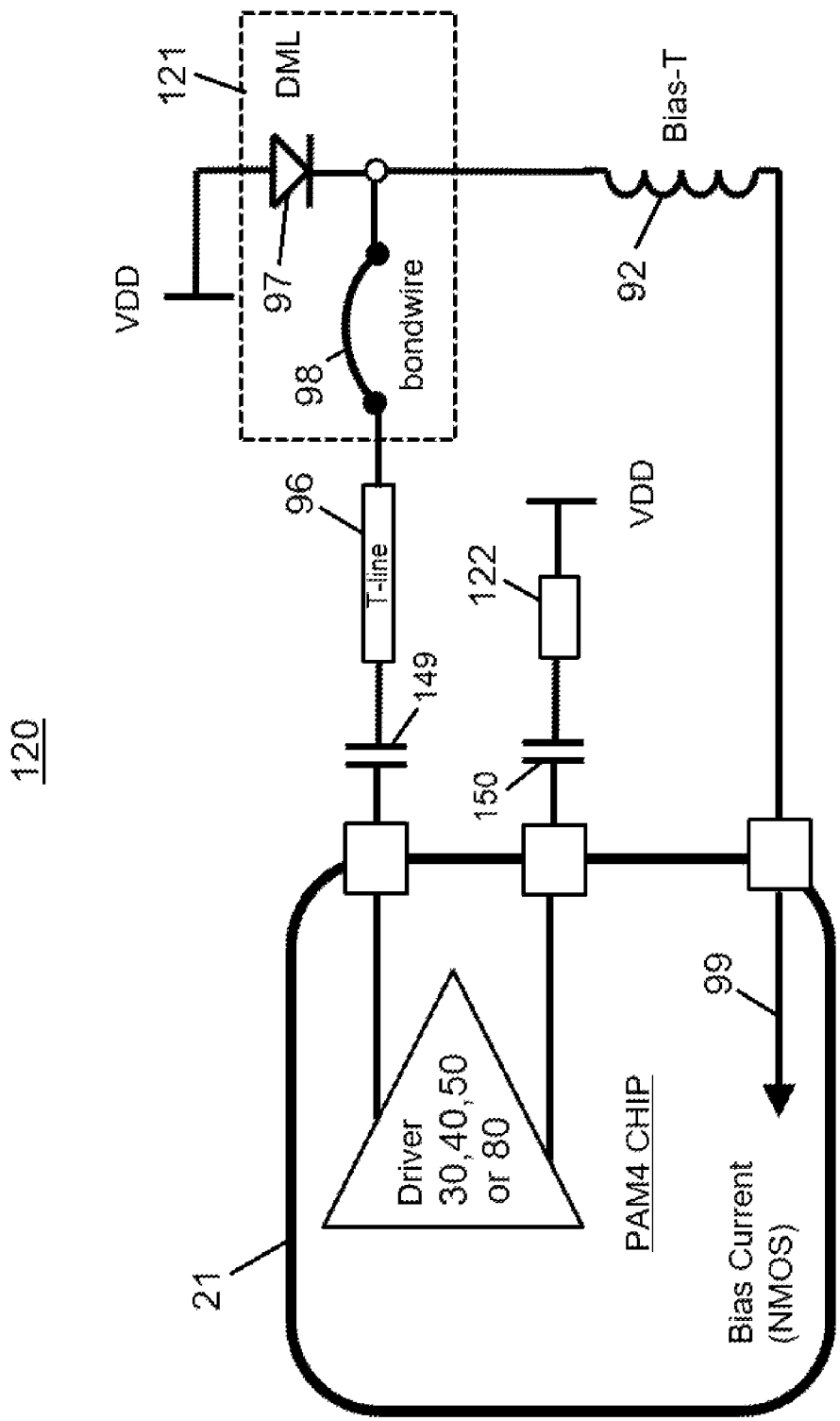
FIG. 12 is a block diagram of another exemplary application for the present invention as a driver with an NMOS bias circuit in a single-ended DML system.

FIG. 12 shows a block diagram of another exemplary implementation 120 for the present invention as a driver 30, 40, 50 or 80 for an NMOS circuit in a DML system 121. Here, the DML 121 is driven single-ended. Transmission line 96 may present a single-ended impedance, e.g. a 25-ohm impedance. A resistor 122 may be provided for proper load-balancing, e.g. 25 ohms. All other elements of implementation 120 operate as in previously described embodiments.

Figure 13:
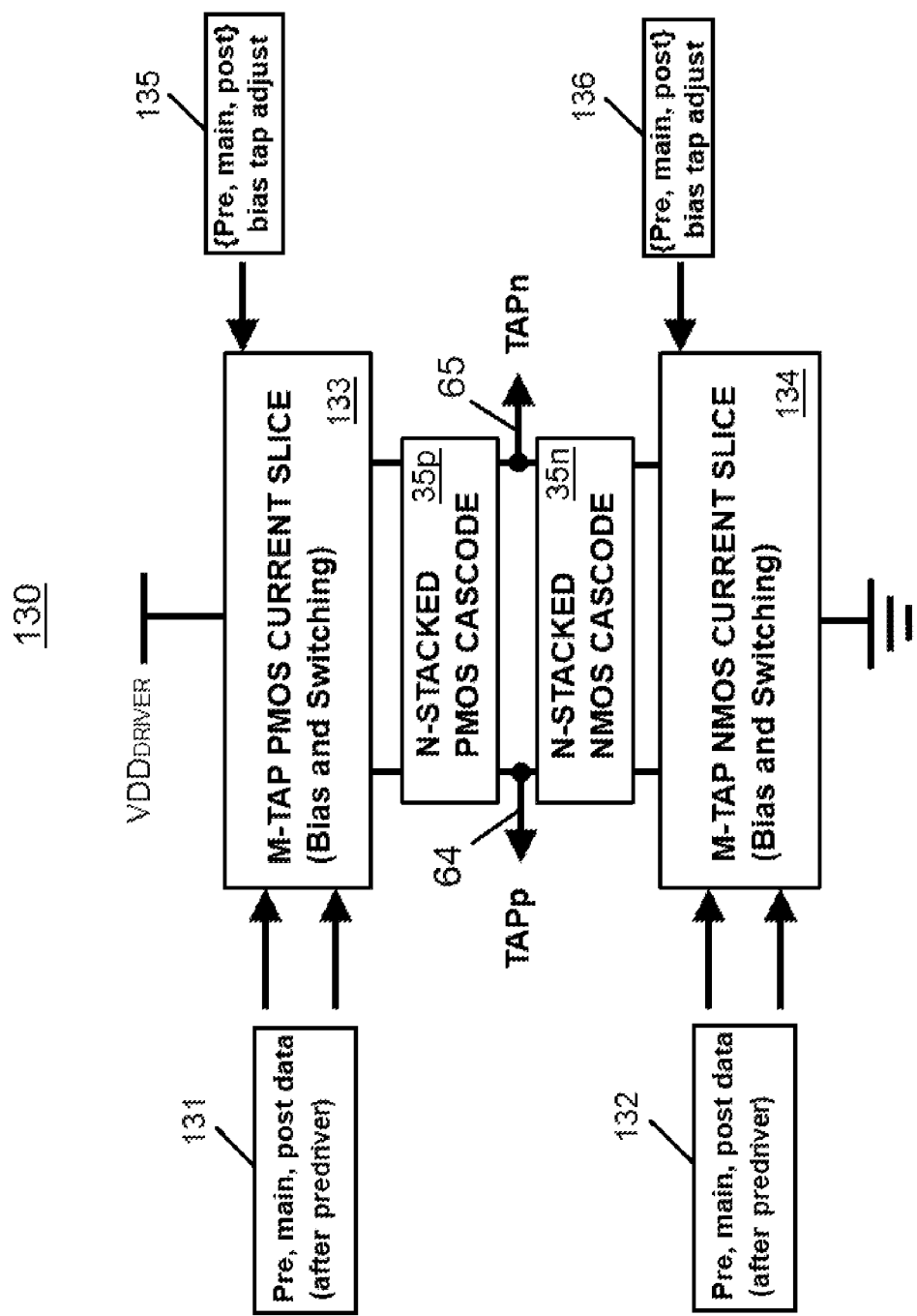
FIG. 13 is a block diagram of another embodiment of the invention in which the PMOS and NMOS DACs are replaced with an analog-based FFE in an H-bridge integrated laser driver.

FIG. 13 shows an analog-based feed forward equalizer (FFE) driver implementation 130, as an alternative to DAC-based drivers as previously presented. Instead of using a DAC-based driver that utilizes DSP such as finite impulse response (FIR) filtering, an analog filter approach can be used. For this approach, the driver is broken up into two or more slices. In exemplary implementation 130, three slices are shown: (1) pre-cursor, (2) main-cursor, and (3) post-cursor, which are denoted "pre, main, post" in the figure. Other configuration such as main, post1, post2, or main, post1, etc. can also be implemented. Each tap can use multiple slices and its amplitude may be adjusted by adjusting the bias current of each tap. In an exemplary operation, data sources 131 and 132 would generate an M-tap digital FFE datastream to control the PMOS 133 and NMOS 134 M-tap current slices, respectively. In one example, this may be achieved by using delay flip-flops (DFFs) to delay the data by 1 clock cycle and generate the pre-main-post data. The amplitude or weight of each M-tap can be adjusted by modifying the bias 135 and 136 for PMOS and NMOS M-tap current slices 133 and 134, respectively. The amount of amplitude sets the amount of FIR filtering.

An H-bridge integrated laser driver according to the present invention is believed to exhibit better overall operation than drivers having CML or SST technology. The table below provides a qualitative comparison of the operability of all three options:

nents of any particular embodiment. An exemplary method for manufacturing a laser driver according to a configuration described herein embodies the invention as an integrated circuit for a CMOS PAM4 communication chip.

Figure 14:
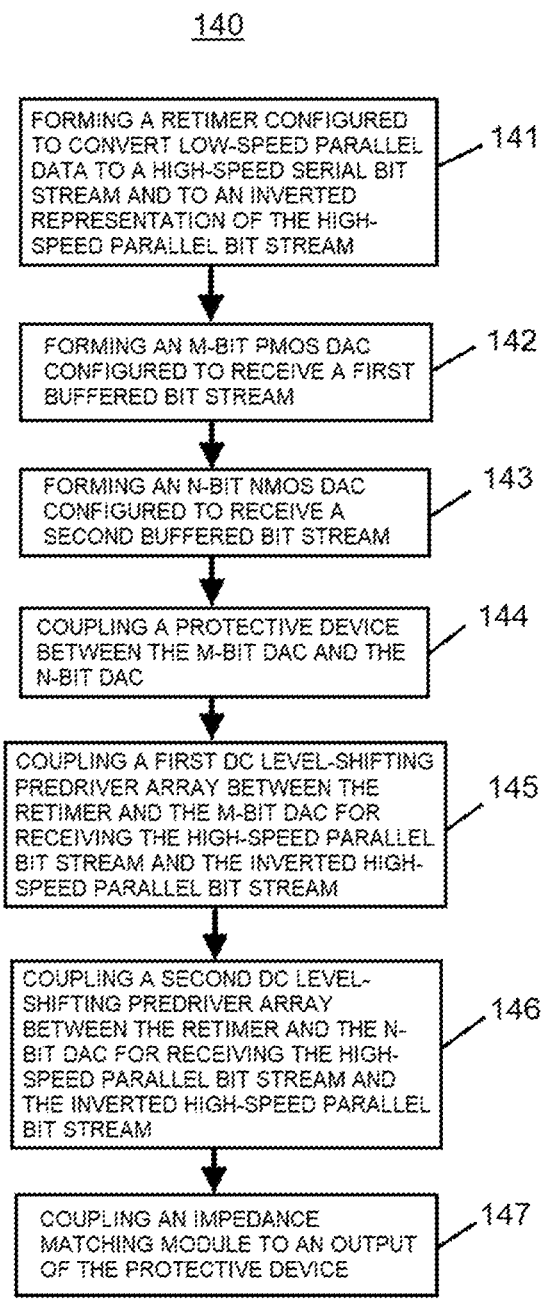
FIG. 14 is a process flow diagram illustrating salient steps of a method for manufacturing an H-bridge integrated laser driver according to one embodiment of the present invention.

FIG. 14 shows a process flow diagram illustrating salient steps of a method 140 for manufacturing an H-bridge integrated laser driver according to one embodiment of the present invention. The steps of method 140 may be performed in any desired order. For example, the method may begin with step 141, in which a retimer is formed and configured to convert low-speed parallel data to a high-speed serial bit stream and to an inverted representation of the high-speed parallel bit stream. Next, in step 142, an M-bit PMOS DAC is formed and configured to receive a first buffered bit stream, and in step 143 an N-bit NMOS DAC is formed and configured to receive a second buffered bit stream. In step 144, a protective device is coupled between the M-bit DAC and the N-bit DAC. In step 145, a first DC level-shifting predriver array is coupled between the retimer and the M-bit DAC for receiving the high-speed parallel bit stream and the inverted high-speed parallel bit stream. In step 146, a second DC level-shifting predriver array is coupled between the retimer and the N-bit DAC for receiving the high-speed parallel bit stream and the inverted high-speed parallel bit stream. In the final step, an impedance matching module is coupled to an output of the protective device. In other embodiments, additional process steps as disclosed herein may supplement method 140.

Exemplary embodiments of the invention have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

TABLE 1

Qualitative Comparison of Driver Solutions

| Feature | CML | SST | Present Invention |
|---|---|---|---|
| Reliability at high-swing | GOOD - can easily stack cascodes | POOR - difficult to place cascodes | GOOD - can easily stack cascodes |
| Low-Vdd, low-swing performance | GOOD | BEST - 4X better current eff. than CML | POOR (limited headroom due to two DCAs) |
| Single-ended performance at high-swing | MEDIUM - requires very high Vdd to match impedances | N/A - difficult to solve reliability issues | GOOD - easy to match impedance |
| Power dissipation at high-swing (>1.5 Vpp, s-e) | VERY HIGH requires high Vdd and highest current of among all 3 options | N/A - difficult to solve reliability issues | MEDIUM - 2X better better current efficiency than CML |
| Output impedance trim | GOOD | DIFFICULT | GOOD |

In view of the foregoing descriptions, those skilled in the relevant art will understand that a laser driver according to any of the various embodiments herein may be manufactured according to known fabrication techniques as an integrated circuit that includes any of the various components and devices presented herein, or a grouping of those components, or substantially all components, or all compo-

What is claimed is:

1. An H-bridge integrated laser driver, comprising:
   a retimer configured to convert low-speed parallel data to a high-speed serial bit stream and to an inverted representation of the high-speed parallel bit stream;
   an M-bit PMOS DAC configured to receive a first buffered bit stream;

an N-bit NMOS DAC configured to receive a second buffered bit stream;

a protective device coupled between the M-bit DAC and the N-bit DAC;

a first DC level-shifting predriver array coupled between the retimer and the M-bit DAC for receiving the high-speed parallel bit stream and the inverted high-speed parallel bit stream;

a second DC level-shifting predriver array coupled between the retimer and the N-bit DAC for receiving the high-speed parallel bit stream and the inverted high-speed parallel bit stream; and an impedance matching module coupled to an output of the protective device;

wherein the first buffered bit stream is substantially synchronized with the second buffered bit stream.

2. The laser driver of claim 1 wherein the retimer comprises a serializer.

3. The laser driver of claim 1 wherein M=N.

4. The laser driver of claim 1 wherein M=1.

5. The laser driver of claim 1 wherein signal inversion occurs at input to one or both of the predriver arrays.

6. The laser driver of claim 1 wherein signal inversion occurs at output of one or both of the predriver arrays.

7. The laser driver of claim 1 wherein the first buffered bit stream and the second buffered bit stream are substantially identical.

8. The laser driver of claim 1 wherein the protective device limits VGD, VGS and VDS to less than a breakdown voltage of the PMOS DAC.

9. The laser driver of claim 1 wherein the protective device limits VGD, VGS and VDS to less than a breakdown voltage of the NMOS DAC.

10. The laser driver of claim 1 wherein the protective device reduces capacitance at the output of the laser driver.

11. The laser driver of claim 1 wherein the protective device comprises one or more cascode stages.

12. The laser driver of claim 1 wherein the impedance matching module is configured to match impedance of either a 25-ohm or a 50-ohm system.

13. The laser driver of claim 1 wherein the impedance matching module comprises a resistor coupled across differential terminals of the laser driver.

14. The laser driver of claim 1 wherein the impedance matching module comprises a T-coil coupled between on-chip impedance and an output terminal of the driver, wherein the T-coil includes a center tap that is connected to an output of the protective device.

15. The laser driver of claim 1 wherein the impedance matching module comprises a center tap between differential terminals of the driver, resistors coupled between each differential terminal and the center tap, and an AC grounding capacitor coupled to the center tap.

16. The laser driver of claim 15 further comprising a T-coil or inductor may be coupled between each resistor and the driver output, to improve high-frequency impedance matching and output bandwidth.

17. The laser driver of claim 1 formed as a system on an integrated circuit chip.

18. The laser driver of claim 1 implemented as a driver for a DML or an EML.

19. The laser driver of claim 18 implemented as a differential driver for an NMOS bias circuit.

20. The laser driver of claim 18 implemented as a single-ended driver.

21. The laser driver of claim 20 implemented as a PMOS bias circuit.

22. A method for manufacturing an integrated laser driver for a CMOS PAM4 communication chip for electro-absorption modulated laser (EML) and directly modulated laser diode (DML) applications, comprising:

forming a retimer configured to convert low-speed parallel data to a high-speed serial bit stream and to an inverted representation of the high-speed parallel bit stream;

forming an M-bit PMOS DAC configured to receive a first buffered bit stream;

forming an N-bit NMOS DAC configured to receive a second buffered bit stream;

coupling a protective device between the M-bit DAC and the N-bit DAC;

coupling a first DC level-shifting predriver array between the retimer and the M-bit DAC for receiving the high-speed parallel bit stream and the inverted high-speed parallel bit stream;

coupling a second DC level-shifting predriver array between the retimer and the N-bit DAC for receiving the high-speed parallel bit stream and the inverted high-speed parallel bit stream; and coupling an impedance matching module to an output of the protective device.

23. The method of claim 22 wherein coupling the protective device reduces capacitance at the output of the laser driver.

24. The method of claim 22 wherein coupling the protective device comprises coupling one or more cascode stages between the M-bit DAC and the N-bit DAC.

* * * * *